US012736598B2

(12) United States Patent
Franke

(10) Patent No.: US 12,736,598 B2
(45) Date of Patent: Sep. 15, 2026

(54) SENSOR DEVICE WITH A LATERALLY ARRANGED DOUBLE COIL AND A PLURALITY OF MAGNETIC FIELD SENSORS

(71) Applicant: TDK—Micronas GmbH, Freiburg (DE)

(72) Inventor: Jörg Franke, Freiburg (DE)

(73) Assignee: TDK—Micronas GmbH, Freiburg (DE)

( * ) Notice: Subject to any disclaimer, the term of this patent is extended or adjusted under 35 U.S.C. 154(b) by 1 day.

(21) Appl. No.: 16/750,748

(22) Filed: Jan. 23, 2020

(65) Prior Publication Data

US 2020/0241083 A1 Jul. 30, 2020

(30) Foreign Application Priority Data

Jan. 25, 2019 (DE) ..................... 10 2019 101 931.1

(51) Int. Cl.
*G01R 33/00* (2006.01)
*G01D 5/14* (2006.01)
*H01F 5/04* (2006.01)

(52) U.S. Cl.
CPC ......... *G01R 33/0094* (2013.01); *G01D 5/145* (2013.01); *G01R 33/0005* (2013.01); *G01R 33/0035* (2013.01); *H01F 5/04* (2013.01)

(58) Field of Classification Search
CPC ............ G01R 33/0094; G01R 33/0005; G01R 33/0035; G01D 5/145
See application file for complete search history.

(56) References Cited

U.S. PATENT DOCUMENTS 5,084,311 A * 1/1992 Liu .................. G01R 33/34007 174/77 R
5,167,983 A * 12/1992 Liu .................. G01R 33/34007 427/105
6,208,884 B1 * 3/2001 Kumar ................. A61B 5/4244 600/409
6,707,298 B2 * 3/2004 Suzuki ................. G01R 33/093 324/252
7,345,470 B2 3/2008 Suzuki
7,573,262 B2 * 8/2009 Sato ................... G01R 33/0005 324/252
8,836,062 B2 * 9/2014 Franke ...................... H01F 5/00 257/427
2009/0167301 A1 * 7/2009 Ausserlechner ... G01R 33/0035 324/252

(Continued)

FOREIGN PATENT DOCUMENTS

DE 60213539 T2 8/2007
DE 102011016159 B3 10/2012
DE 112010000848 B4 4/2018

*Primary Examiner* — Alesa Allgood
(74) *Attorney, Agent, or Firm* — 24IP Law Group USA, PLLC; Timothy R DeWitt

(57) ABSTRACT

A sensor device (10) is described. The sensor device (10) comprises a laterally arranged double coil (20) with a first coil (30*a*) and a second coil (30*b*), wherein first windings (40*a*) of the first coil (30*a*) and second windings (40*b*) of the second coil (40*b*) are arranged in a spiral shape. The first windings (40*a*) from a first center point (50*a*) lead to a common region (60) and the second windings (40*b*) from a second center point (50*b*) lead to the common region (60) as well. At least one magnetic field sensor (70, 72*a*, 72*b*) is disposed on the laterally arranged double coil (20).

9 Claims, 4 Drawing Sheets

(56) References Cited

U.S. PATENT DOCUMENTS

| | | | | |
|---|---|---|---|---|
| 2009/0230955 | A1* | 9/2009 | Kejik | G01R 33/04 324/253 |
| 2018/0292469 | A1* | 10/2018 | Hohe | G01R 33/0017 |
| 2018/0340989 | A1 | 11/2018 | Latham et al. | |

* cited by examiner

SENSOR DEVICE WITH A LATERALLY ARRANGED DOUBLE COIL AND A PLURALITY OF MAGNETIC FIELD SENSORS

CROSS-REFERENCE TO RELATED APPLICATIONS

This application claims priority to and benefit of German Patent Application No. DE 10 2019 101 931.1 filed on Jan. 29, 2019, the contents of which are incorporated herein by reference in their entirety.

BACKGROUND OF THE INVENTION

Field of the Invention

The invention relates to a sensor device with a coil.

Brief Description of the Related Art

Sensor devices of the type mentioned above are known, for example, from the German patent no. DE 11 2010 000 848 B4 (Allegro). In this patent document, a double coil is disclosed, however which has only one winding in each case as a self-text conductor, and wherein each coil of the double coil is located above a z-axis magnetic-field sensor element.

From the German patent no. DE 10 2011 016 159 B3 the integration of a vertical coil (i.e. repetition of the windings in the z-direction and not in the x- or y-directions) with several windings above a z-axis magnetic field sensor is known. The patent document also discloses the integration of two vertical coils with several windings above a z-axis magnetic-field sensor in each case.

A different device is also known from the U.S. Pat. No. 7,345,470, which shows a plurality of non-integrated coils for sample testing.

The state of the art shows solutions for sensor devices with coils with single windings, which limit the possible coil factor and thus also the obtainable magnetic field in relation to the current fed to the coils.

Moreover, the integration costs for the sensor devices with vertically arranged windings are increased due to the necessary several metal plies or separate coil carriers.

SUMMARY OF THE INVENTION

The present is a sensor device comprising a laterally arranged double coil with a first coil and a second coil. First windings of the first coil and second windings of the second coils are arranged in a spiral shape on a substrate, and both the first windings and the second windings extend in each case from a first or second center point of the corresponding spiral to a common region. At least one magnetic field sensor is located in a mounted state on the laterally arranged double coil.

Using this device, the magnetic field sensor can be calibrated well also in the presence of superimposed fields. The arrangement permits a diagnosis in the event of a disturbance of the magnetic field sensors also in an environment with, for example, stray fields.

The magnetic field sensor is, for example, a Hall sensor, an AMR sensor, a GMR sensor, a flux-gate sensor or a TMR sensor, with the type of magnetic field sensor not being limiting for the invention, however.

DESCRIPTION OF THE DRAWINGS

For a more complete understanding of the present invention and the advantages thereof, reference is now made to the following description and the accompanying drawings, in which.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
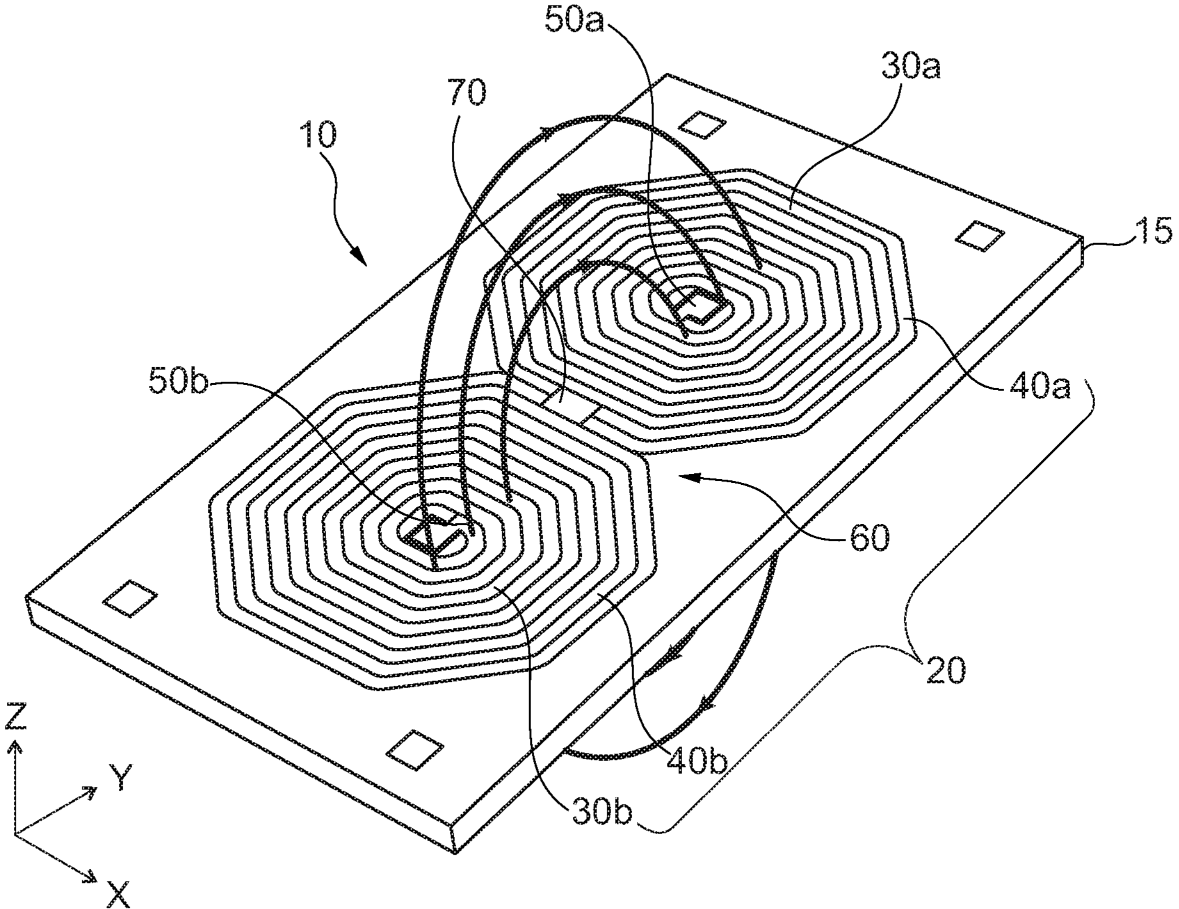
FIG. 1 shows a double coil with a magnetic field sensor and exemplary field lines.

FIG. 1 shows a sensor arrangement 10 with a laterally arranged double coil 20 formed of a first coil 30*a* and a second coil 30*b* on a substrate 15. The first coil 30*a* has windings 40*a* formed in a spiral shape from a first center point 50*a* of the first coil 30*a* to a common region 60. The common region 60 is located between the first coil 30*a* and the second coil 30*b* and is arranged at the center of the double coil 20. The second coil 30*b* has second windings 40*b* formed in a spiral shape from a second center point 50*b* of the second coil 30*b* to the common region 60. The first windings 40*a* and the second windings 40*b* are shown in FIG. 1 as a clockwise Archimedes spiral, but both could be counterclockwise as well. It is apparent that the second coil 30*b* is formed from a mirror image of the first coil 30*a* on the x and y axes.

The first windings 40*a* of the first coil 30*a* and the second windings 40 of the second coil 30*b* are electrically interconnected at the common region 60. Due to the arrangement of the first windings 40*a* and of the second windings 40*b*, the current direction in the first coil 30*a* and the second coil 30*b* is in opposite directions. The winding spacings in the first coil 30*a* and in the second coil 30*b* are kept as small as possible in order for a current density to be attainable that is as high as possible. Exemplary parameters are 40 μm for the conductor path width of the coils and 2 μm for the spacing of the conductor paths. However, these parameters are not limiting for the invention. Depending on the thicknesses of the metal layer used, the spacings can also be substantially different, however.

In one aspect of the invention, a magnetic field sensor 70 is located on the upper side of the double coil 20 at the common region 60, i.e. is disposed between the first coil 30*a* and the second coil 30*b*. The magnetic field sensor 70 can also be disposed below the double coil 20. The magnetic field sensor 70 is a TMR sensor or a Hall sensor, whereby the choice is not limiting of the invention.

When current is applied to the double coil 20, one of the first coil 30 or the second coil 30*b* generates a magnetic field in the z-direction (i.e. perpendicularly to the x-y-plane), and the other one of the first coil 30 or the second coil 30*b* generates a magnetic field opposite to the z-direction. This results in the current density through the two coils 30*a* and 30*b* being amplified at the common region at the magnetic field sensor 70. The generated magnetic field is shown in FIG. 1 as field lines.

Figure 4:
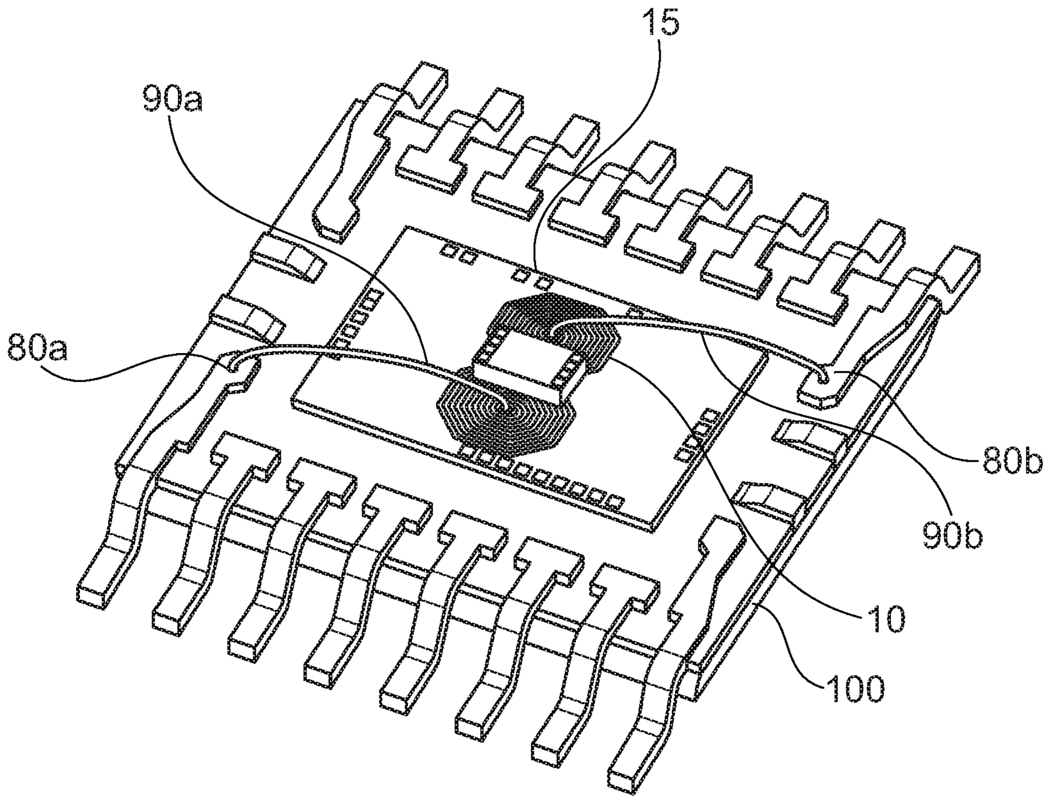
FIG. 4 shows a sensor arrangement in a conductor carrier (lead frame).

The first center point 50*a* of the first coil 30*a* is electrically connected via a first bond wire 90*a* to a first connector 80*a* on a lead frame (connection frame/conductor carrier) of a housing 100. The second center point 50*b* of the second coil 30*b* is electrically connected via a second bond wire 80*b* to a second connector 80*b* of the lead frame of the housing 100. This connection can also be established via conductor paths in a further metal ply. These connections are shown in FIG. 4.

Figure 2:
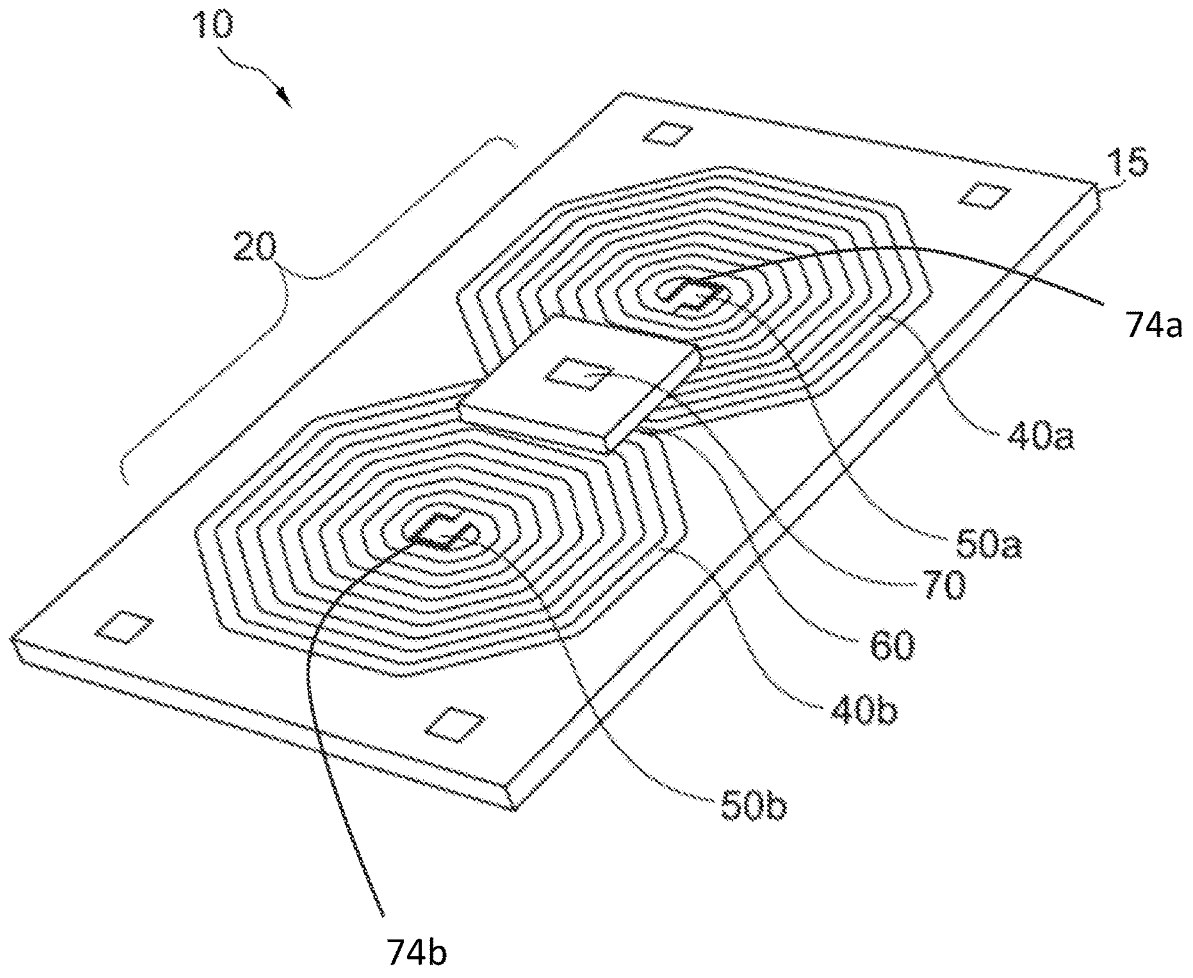
FIG. 2 shows a double coil with a magnetic field sensor on a die.

FIG. 2 shows a further aspect of the invention, in which the magnetic field sensor 70 is applied to a chip 75 (a so-called "die"). In other words, the z-direction is offset from the plane of the double coil.

Figure 3:
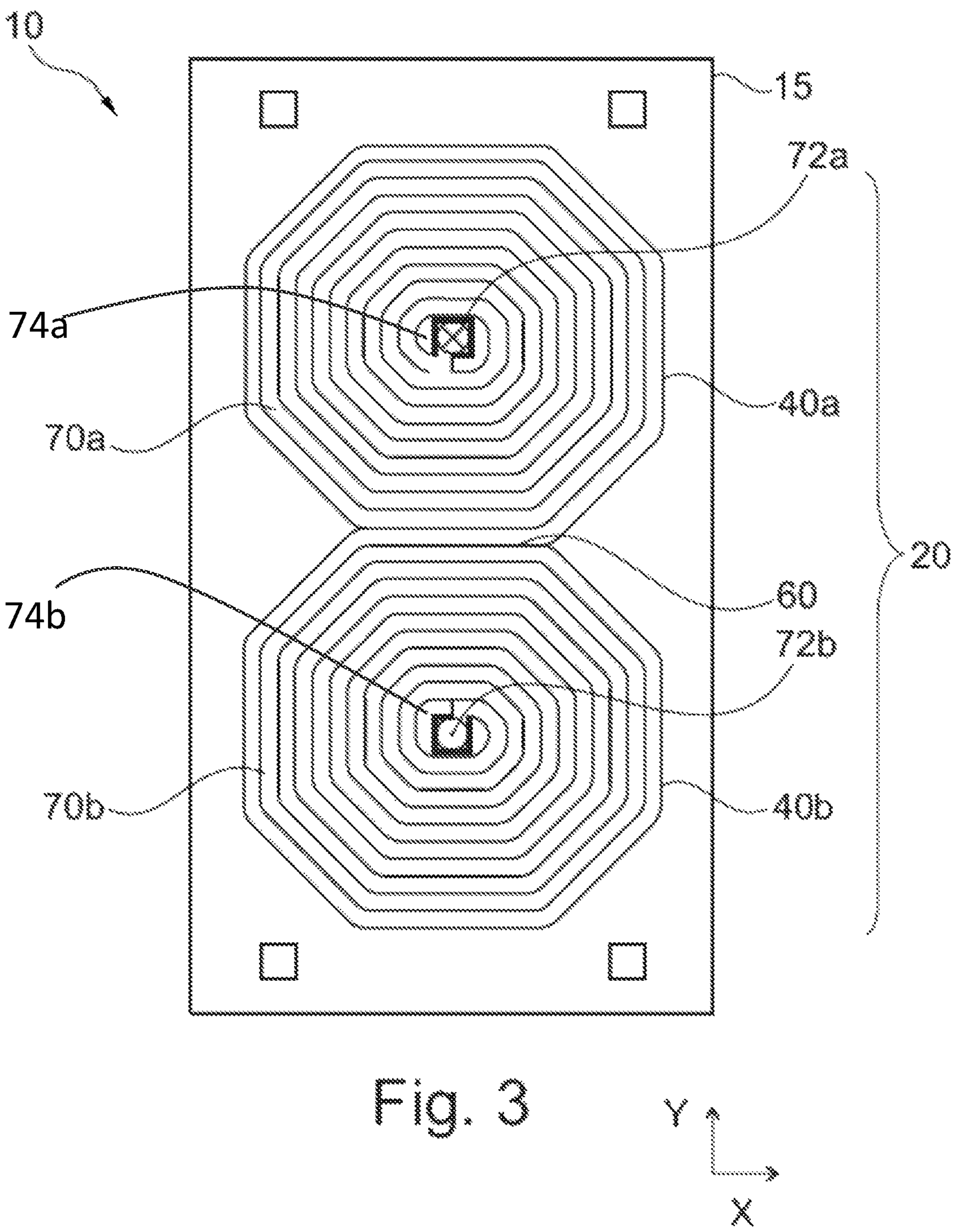
FIG. 3 shows a double coil with two magnetic field sensors and exemplary field lines.

FIG. 3 shows a further aspect of the invention, in which two magnetic field sensors 72*a* and 72*b* are disposed in each case in the center points 50*a* and 50*b* of the corresponding coil 30*a* and 30*b*. The two magnetic field sensors 72*a* and 72*b* are either located below a bond pad 74*a*, 74*b* or the two magnetic field sensors 72*a* and 72*b* are each an interconnection of several individual sensors of which the common effective point is located below the bond pad 74*a*, 74*b*. Four TMR elements in a Wheatstone bridge or four magnetic field sensors 72*a* and 72*b* connected in parallel for improving the signal-noise ratio could be used, for example.

In this aspect of the invention, the first coil 30*a* and the second coil 30*b* can be configured such that the magnetic field sensors 72*a* and 72*b* measure the same field component. In this case, the first coil 30*a* and the second coil 30*b* are configured in opposite winding directions, i.e. a clockwise spiral (first windings 40*a*) and a counterclockwise spiral (second windings 40*b*). Differently to FIG. 1, the windings are therefore mirrored only on the x-axis. The current direction is consequently in the same direction in the first coil 30*a* and the second coil 30*b* and is shown in FIG. 3 by the cross and point symbol.

In a different aspect of the sensor arrangement shown in FIG. 3, the magnetic-field sensors 72*a* and 72*b* are operated differentially and the coils 30*a* and 30*b* are configured with windings 40*a* and 40*b* with the same winding direction as in FIG. 1, wherein the current direction in the corresponding coils 30*a* and 30*b* is contrary.

FIG. 4 shows the sensor device in a lead frame (connection frame) 100. The first center point 50*a* and the second center point 50*b* are electrically connected in each case to connectors 80*a*, 80*b* via bond wires 90*a*, 90*b*.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

REFERENCE NUMERALS

10 sensor device
15 substrate
20 double coil
30*a* first coil
30*b* second coil
40*a* first windings
40*b* second windings
50*a* first center point
50*b* second center point
60 common region
70 magnetic field sensor
72*a* magnetic field sensor
72*b* magnetic field sensor
75 chip
80*a* first connector
80*b* second connector
90*a* first bond wire
90*b* second bond wire
100 housing

What is claimed is:

1. A sensor device comprising: a laterally arranged double coil with a first coil and a second coil, wherein first windings of the first coil and second windings of the second coil are arranged in a spiral shape and wherein the first windings lead from a first center point to a common region and the second windings lead from a second center point to the common region; and a plurality of magnetic field sensors disposed on the laterally arranged double coil, wherein the plurality of magnetic field sensors are an interconnection of a plurality of individual sensors, wherein a common effective point of the magnetic field sensors is located below a bond pad, and wherein the magnetic field sensors are disposed in the center points of the corresponding coil.

2. The sensor device according to claim 1, wherein the plurality of magnetic field sensors are applied to a chip.

3. The sensor device according to claim 1, wherein the plurality of magnetic-field sensors are disposed on the double coil.

4. The sensor device according to claim 1, wherein the first windings of the first coil are executed in a same winding direction as the second windings of the second coil.

5. The sensor device according to claim 1, wherein the plurality of magnetic field sensors are located in the common region.

6. The sensor device according to claim 1, wherein the plurality of magnetic field sensors are at least one of a Hall sensor, a flux gate or an MR sensor.

7. The sensor device according to claim 1, wherein the first center point and the second center point are electrically connected to connectors via bond wires.

8. The sensor device according to claim 1, wherein the first windings of the first coil are executed in the direction contrary to the second windings of the second coil.

9. The sensor device according to claim 1, wherein the plurality of individual sensors are at least four TMR elements in a Wheatstone Bridge or four Hall elements connected in parallel.

* * * * *